(12) United States Patent
Ogawa

(10) Patent No.: US 9,076,529 B2
(45) Date of Patent: Jul. 7, 2015

(54) LEVEL SHIFT CIRCUIT AND SEMICONDUCTOR DEVICE USING LEVEL SHIFT CIRCUIT

(75) Inventor: Akira Ogawa, Tokyo (JP)

(73) Assignee: POWERCHIP TECHNOLOGY CORP., Hsin-Chu (TW)

( * ) Notice: Subject to any disclaimer, the term of this patent is extended or adjusted under 35 U.S.C. 154(b) by 277 days.

(21) Appl. No.: 13/549,204

(22) Filed: Jul. 13, 2012

(65) Prior Publication Data

US 2013/0249595 A1  Sep. 26, 2013

(30) Foreign Application Priority Data

Mar. 23, 2012 (JP) .................... 2012-067561

(51) Int. Cl.
H03K 19/094 (2006.01)
G11C 16/06 (2006.01)
G11C 16/30 (2006.01)
G11C 7/10 (2006.01)

(52) U.S. Cl.
CPC ............ *G11C 16/06* (2013.01); *G11C 16/30* (2013.01); *G11C 7/1084* (2013.01); *G11C 7/1087* (2013.01)

(58) Field of Classification Search
CPC .............. H03K 19/018521; H03K 19/0185
See application file for complete search history.

(56) References Cited

U.S. PATENT DOCUMENTS

| | | | | |
|---|---|---|---|---|
| 4,521,695 A * | 6/1985 | Mazin et al. | ............. | 327/211 |
| 5,559,464 A * | 9/1996 | Orii et al. | ............. | 327/333 |
| 5,825,205 A * | 10/1998 | Ohtsuka | ............. | 326/81 |
| 6,351,173 B1 * | 2/2002 | Ovens et al. | ............. | 327/333 |
| 7,023,255 B1 * | 4/2006 | Mercer | ............. | 327/199 |
| 7,218,145 B2 * | 5/2007 | Nunokawa | ............. | 326/68 |
| 7,265,583 B2 * | 9/2007 | Hirano | ............. | 326/78 |
| 7,301,386 B2 * | 11/2007 | Chen et al. | ............. | 327/333 |
| 7,737,757 B2 * | 6/2010 | Behrends et al. | ............. | 327/333 |
| 7,768,296 B2 * | 8/2010 | Kase et al. | ............. | 326/27 |
| 7,965,123 B2 * | 6/2011 | Su | ............. | 327/333 |
| 8,575,962 B2 * | 11/2013 | Yang et al. | ............. | 326/80 |
| 8,710,895 B2 * | 4/2014 | Jo | ............. | 327/333 |
| 2002/0024374 A1 | 2/2002 | Ovens et al. | | |
| 2008/0290902 A1 | 11/2008 | Koto | | |
| 2014/0002179 A1 * | 1/2014 | Ogawa | ............. | 327/540 |

FOREIGN PATENT DOCUMENTS

| | | |
|---|---|---|
| JP | 851351 C | 9/1977 |
| JP | 20041533446 A | 5/2004 |
| JP | 2007096865 A | 4/2007 |
| TW | M350180 | 2/2009 |

OTHER PUBLICATIONS

Office Action issued on Nov. 26, 2014 by the Taiwanese Patent Office in corresponding TW Patent Application No. 101141726.

* cited by examiner

*Primary Examiner* — Jason M. Crawford
*Assistant Examiner* — Nelson Correa
(74) *Attorney, Agent, or Firm* — Muncy, Geissler, Olds & Lowe, P.C.

(57) ABSTRACT

A level shift circuit, for outputting a data output signal with a second level via an output inverter after a data input signal with a first level is stored in a latch, includes a level set circuit, when the output data signal outputs with a low level, setting the output data signal to a low level in response to a change of the input data signal. The level set circuit is connected to an output terminal of the output inverter, and has an NMOS transistor having a drain electrode and a source electrode coupled to a ground, wherein the NMOS transistor turns on in response to the input data signal with a high level.

14 Claims, 16 Drawing Sheets

| Worst State | | | | Delay Time | |
|---|---|---|---|---|---|
| VDD | VCC | DIN | DOUT | Prior Art | 1st Embodiment |
| 1.55V | 1.55V | ↑ | ↓ | 12.1ns | 2.4ns |
| | | ↓ | ↑ | 3.2ns | 3.3ns |
| 1.55V | 2.5V | ↑ | ↓ | 4.0ns | 3.4ns |
| | | ↓ | ↑ | 2.7ns | 2.5ns |

FIG. 20

| Standard State | | | | Delay Time | |
|---|---|---|---|---|---|
| VDD | VCC | DIN | DOUT | Prior Art | 1st Embodiment |
| 1.8V | 1.8V | ↑ | ↓ | 5.4ns | 0.9ns |
| | | ↓ | ↑ | 1.6ns | 1.6ns |
| 1.8V | 3.3V | ↑ | ↓ | 2.0ns | 1.7ns |
| | | ↓ | ↑ | 1.4ns | 1.4ns |

FIG. 21

| VDD | VCC | DIN | DOUT | Delay Time |
|---|---|---|---|---|
| 1.8V | 1.8V | ↗ | ↘ | 5.4ns |
| | | ↘ | ↗ | 1.6ns |
| 1.8V | 3.3V | ↗ | ↘ | 2.0ns |
| | | ↘ | ↗ | 1.4ns |

FIG. 25 (PRIOR ART)

LEVEL SHIFT CIRCUIT AND SEMICONDUCTOR DEVICE USING LEVEL SHIFT CIRCUIT

CROSS REFERENCE TO RELATED APPLICATIONS

This Application claims priority of Japan Patent Application No. 2012-67561, filed on Mar. 23, 2012, the entirety of which is incorporated by reference herein.

BACKGROUND OF THE INVENTION

1. Field of the Invention

The disclosure relates generally to a semiconductor device using a level shift circuit, and a level shift circuit having a latch used in a semiconductor device, such as a NAND type flash memory.

2. Description of the Related Art

In semiconductor devices such as a NAND flash memory, for the requirement of versatility, one semiconductor device (chip device) is designed for operation with some external power supply voltages, such as 3.3V and 1.8V.

FIG. 22 is a block diagram illustrating a power supply voltage usage state of each circuit when the external power supply voltage VCC=3.3V is applied to the flash memory of the prior art. In addition, FIG. 23 is a block diagram illustrating a power supply voltage usage state of each circuit when the external power supply voltage VCC=1.8V is applied to the flash memory of the prior art. In FIGS. 22 and 23, the NAND type flash memory consists of a cell array 1, a page buffer 2, a row decoder 3, a power supply circuit 4 (a high voltage HV, a middle voltage MV), a power supply circuit 5 (a reference voltage Vref and a low voltage LV), a control logic 6, a buffer and latch, etc. 7, an input/output buffer 8, and an input signal buffer 9.

FIGS. 22 and 23 are the same NAND type flash memory, but different external power supply voltages VCC are applied thereto, and the power supply voltage usage state of each circuit are different. In the embodiment of FIG. 22, the internal power supply voltage VDD in the input/output buffer 8 and the input signal buffer 9 is 3.3V, the internal power supply voltage VDD in a part of page buffer 2, a part of the row decoder 3, the control logic 6 and the buffer and latch, etc. 7 is 1.9V, the internal power supply voltage VDD in another part of page buffer 2, another part of the row decoder 3 and the power supply circuit 4 is 5V. In the embodiment of FIG. 23, the internal power supply voltage VDD in a part of page buffer 2, a part of the row decoder 3, the control logic 6 and the buffer and latch, etc. 7 is 1.8V, and the internal power supply voltage VDD in another part of page buffer 2, another part of the row decoder 3, the power supply circuit 4 the input/output buffer 8 and the input signal buffer 9 is 5V. Thus, for example, there was a need to provide a level shift circuit for level shifting the external voltage to the internal voltage, and level shifting the internal voltage to the external voltage in the internal flash memory.

FIG. 24 is a circuit diagram illustrating an embodiment of a level shift circuit according to the prior art. As shown in FIG. 24, the level shift circuit of the prior art embodiment comprises (1) a latch 10 configured by two inverters 11 and 12 cascaded to each other in a ring shape, (2) an inverter 13 inverting the output data of the latch 10 and outputting the output data signal DOUT (VCC), (3) NMOS transistors 31 and 32 being turned on in response to a latch signal with a high level for indicating a latching operation, (4) an NMOS transistor 21 being turned on in response to the input data signal DIN (VDD) with a high level, (5) an inverter 14 inverting the input data signal DIN (VDD), and (6) an NMOS transistor 22 being turned on in response to the output data signal of the inverter 14 with a high level.

In this embodiment, the sign in the parentheses of the input data signal DIN (VDD) indicates that the high level is the power supply voltage VDD with a high level, and the sign in the parentheses of the output data signal DOUT (VCC) indicates that the high level is the power supply voltage VCC with a high level. Therefore, the level shift circuit is provided with a latch 10 to temporarily hold the input data signal DIN (VDD), level shifts from the voltage VDD to the voltage VCC, and outputs the voltage VCC accordingly. In an embodiment of the NAND type flash memory, in order to output the data signal to an external device, it is necessary to level shift the internal VDD level data signal of the page buffer 2 to the external VCC level data signal.

BRIEF SUMMARY OF THE INVENTION

The Problem to be Solved

For the configuration of the level shift circuit described above, there is a problem where switching speed is relatively slow.

FIG. 25 is a table illustrating experimental results of the delay time in the level shift circuit of FIG. 24. For the case that the voltage VCC is same as the voltage VDD, the delay time between the input data signal DIN rises and when the output data signal DOUT falls, it is very slow. Thus, there is a problem that the time margin of the output cycle of the data signal is small.

In addition, in comparison with the conventional embodiment shown in FIG. 24 which shows the input data signal DIN being applied to the gate electrode of the NMOS transistor 21, if the input data signal DIN is connected to another inverter and its output is connected to the gate electrode of the NMOS transistor 21, such that the input data signal DIN inputs the gate electrode of the NMOS transistor 22, not the output data signal of the inverter 14 inputting the gate electrode of the NMOS transistor 22, there is still the same problem that the delay time between the input data signal DIN falls and when the output data signal DOUT falls, it is very slow.

The purpose of the invention is to solve the above conventional problems for the level shift circuit, such as a level shift circuit of a flash memory, and to provide a level shift circuit and a semiconductor device using the level circuit which can reduce the delay time between the input data signal rises or falls and when the output data signal DOUT falls in comparison to that of prior art.

Solutions of the Problem

An embodiment of a level shift circuit according to the invention, for outputting a data output signal with a second level via an output inverter after a data input signal with a first level is stored in a latch and the level shift circuit comprises a level set circuit, wherein when the output data signal with a low level outputs, setting the output data signal to a low level in response to a change of the input data signal.

In an embodiment, the level set circuit is connected to an output terminal of the output inverter, and has an NMOS transistor having a drain electrode and a source electrode coupled to a ground, wherein the NMOS transistor turns on in response to the input data signal with a high level.

In an embodiment, the level set circuit further comprises a first inverter inverting the input data signal with a high level to an inverted signal, and outputting the inverted signal to the output terminal of the output inverter.

In an embodiment, the level set circuit further comprises: a second inverter, inverting the input data signal with a low level to an inverted signal; and an NMOS transistor, having a drain electrode and a source electrode coupled to a ground, wherein the NMOS transistor turns on in response to the inverted signal.

In an embodiment, the level set circuit outputs the input data signal with a low level to the output terminal of the output inverter.

In an embodiment, the latch has two inverters connected in cascade to each other.

In an embodiment, the latch has four MOS transistors, and the latch is a CMOS flip-flop type latch.

In an embodiment, the latch comprises two PMOS transistors respectively inserted between the two inverters and a power voltage, wherein the latch totally has six MOS transistors, and the latch is a CMOS flip-flop type latch.

In an embodiment, the latch comprises two PMOS transistors respectively inserted between the two inverters and a power voltage, and two NMOS transistors respectively inserted between the two inverters and a ground, wherein the latch totally has eight MOS transistors, and the latch is a CMOS flip-flop type latch.

In an embodiment, the latch and the output inverter comprise transistors driven by a high power voltage higher than the first level, and the second level is higher than the first level.

In an embodiment, the level shift circuit is a semiconductor device incapable of being driven by two power voltages with the first level and the second level.

An embodiment of a semiconductor device comprises the level shift circuit described above.

Effects of the Invention

Therefore, according to the present invention, for changing from a predetermined voltage to a same voltage, the delay time between the input data signal changes and when the output data signal DOUT falls can be much reduced in comparison to that of prior art. Thus, the time margin of the output cycle of the data signal can increase.

BRIEF DESCRIPTION OF DRAWINGS

FIG. 20 is a table illustrating the experimental results of the delay time of the level shift circuit of FIG. 1A in the worst state (100° C. temperature);

FIG. 21 is a table illustrating the experimental results of the delay time of the level shift circuit of FIG. 1A in the standard state (20° C. temperature);

FIG. 25 is a table illustrating experimental results of the delay time in the level shift circuit of FIG. 24.

DETAILED DESCRIPTION OF THE INVENTION

Structures for Embodiments of the Invention

The embodiment of the invention will become more fully understood by referring to the following detailed description with reference to the accompanying drawings.

First Embodiment

Figure 1A:
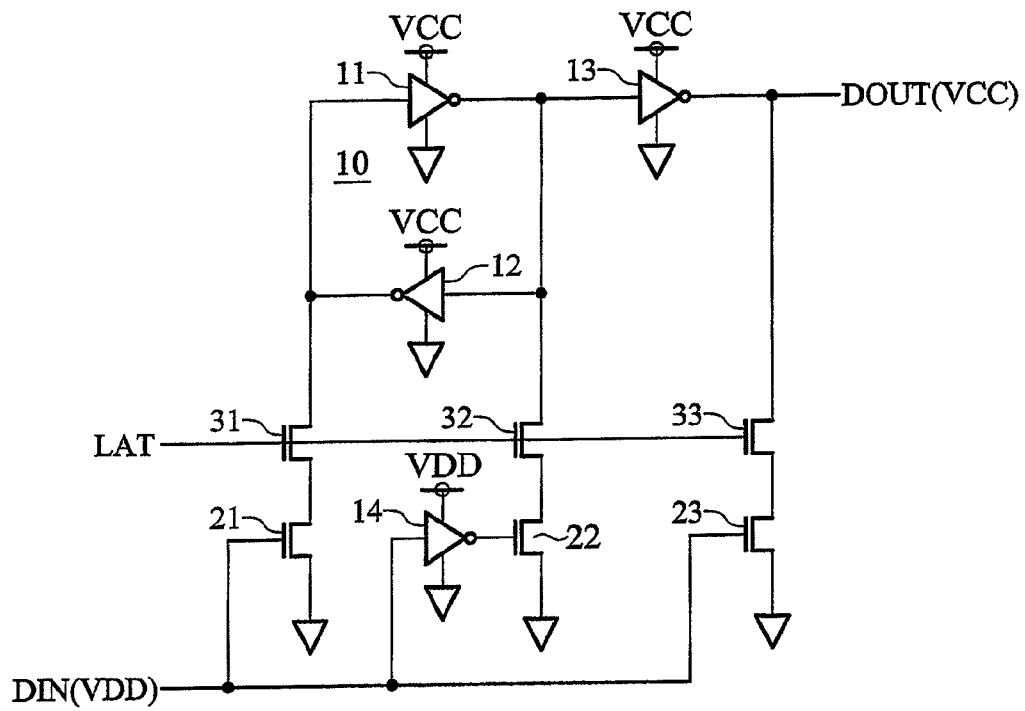
FIG. 1A is a circuit diagram illustrating a first embodiment of a level shift circuit according to the invention.

FIG. 1A is a circuit diagram illustrating a first embodiment of a level shift circuit according to the invention. The level shift circuit of FIG. 1A is used for a semiconductor chip device such as a flash memory, level-shifts an input data signal DIN (VDD) to an output data signal DOUT (VCC), and further comprises a level set circuit for forcing the output data signal DOUT set to a low level when the output data signal DOUT falls, and the level set circuit is configured with an NMOS transistor 23 with its drain electrode connected to ground, such that the delay time between when the input data signal DIN rises and when the output data signal DOUT falls can be much reduced in comparison to that of prior art.

The level shift circuit of FIG. 1A comprises (1) a latch 10 configured by two inverters 11 and 12 cascaded to each other in a ring shape, (2) an inverter 13 inverting the output data of the latch 10 and outputting the output data signal DOUT (VCC), (3) NMOS transistors 31, 32 and 33 being turned on in response to a latch signal with a high level for indicating a latching operation, (4) NMOS transistors 21 and 23 being turned on in response to the input data signal DIN (VDD) with a high level, (5) an inverter 14 inverting the input data signal DIN (VDD), and (6) an NMOS transistor 22 being turned on in response to the output data signal of the inverter 14 with a high level.

Also, the inverters 11-13 are driven by a power voltage VCC, and the inverter 14 is driven by a power voltage VDD.

For the level shift circuit of FIG. 1A configured as described above, when the latch signal LAT with a high level is inputted when a latching operation is being performed, the NMOS transistors 31, 32 and 33 are turned on. At this time, when the input data signal DIN (VDD) rises, and the output data signal DOUT (VCC) for outputting the data of the latch 10 falls, the NMOS transistor 23 forces the output data signal DOUT to be set to low level. Due to the NMOS transistor 23 is further added, the delay time between when the input data signal DIN rises and when the output data signal DOUT falls can be much reduced in comparison to that of prior art. Thus, the time margin of the output cycle of the data signal can be increased. The level shift circuit can be used in semiconductor devices such as a flash memory, for example. Experimental results of the present invention will be described in detail later.

Figure 1B:
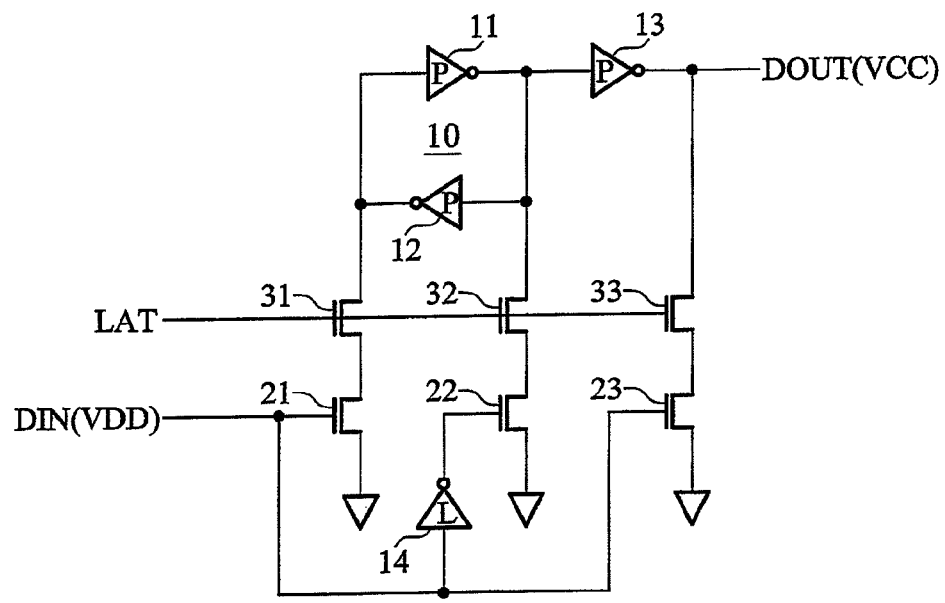
FIG. 1B shows an embodiment of using simple symbol of inverters for the construction of the level shift circuit shown in FIG. 1A.

FIG. 1B shows an embodiment of using simple symbol of inverters for the construction of the level shift circuit shown in FIG. 1A. In this embodiment, each of the inverters 11-14, as shown in FIG. 1A, is configured with the four MOS transistors, and form a well-known CMOS flip-flop type latch 10. Also, to mark the simple symbol of inverters, P indicates that the inverter is driven by a voltage VCC, and L indicates that the inverter is driven by a voltage VDD.

Second Embodiment

Figure 2:
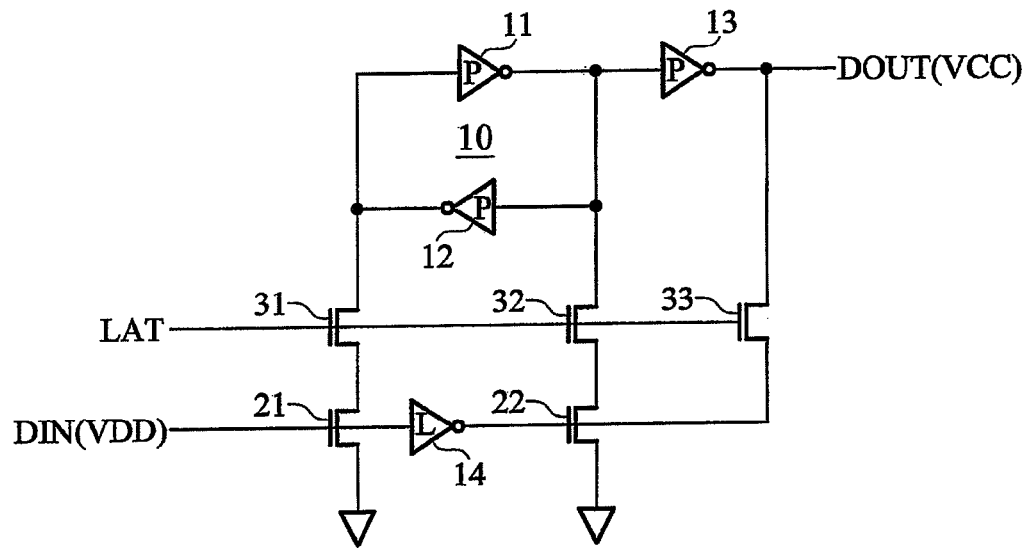
FIG. 2 is a circuit diagram illustrating a second embodiment of a level shift circuit according to the invention using the simple symbol of inverters.

FIG. 2 is a circuit diagram illustrating a second embodiment of a level shift circuit according to the invention using the simple symbol of inverters. To compare the level shift circuit of FIG. 2 with the level shift circuit of FIG. 1B, this embodiment is characterized in that (1) the NMOS transistor 23 has been removed, and (2) the output voltage of the inverter 14 is applied to the predetermined electrode (the lower electrode as shown in FIG. 2, a source electrode or a drain electrode, and different from the electrode connected to the output of the inverter 13 and the gate electrode of NMOS transistor 33) of the NMOS transistor 33.

The level shift circuit of FIG. 2 described above operates as the same as the level shift circuits of FIGS. 1A and 1B do, particularly, the NMOS transistors 31, 32 and 33 are turned on when the latch signal LAT with a high level is inputted when a latching operation is being performed. At this time, when the input data signal DIN (VDD) rises, and the output data signal DOUT (VCC) for outputting the data of the latch 10 falls, the output data signal DOUT is forced to be set to a low level by the output voltage of the inverter 14, such that a delay time between when the input data signal DIN rises and when the output data signal DOUT falls can be much reduced in comparison to that of prior art. Thus, a time margin of the output cycle of the data signal can increase.

Third Embodiment

Figure 3:
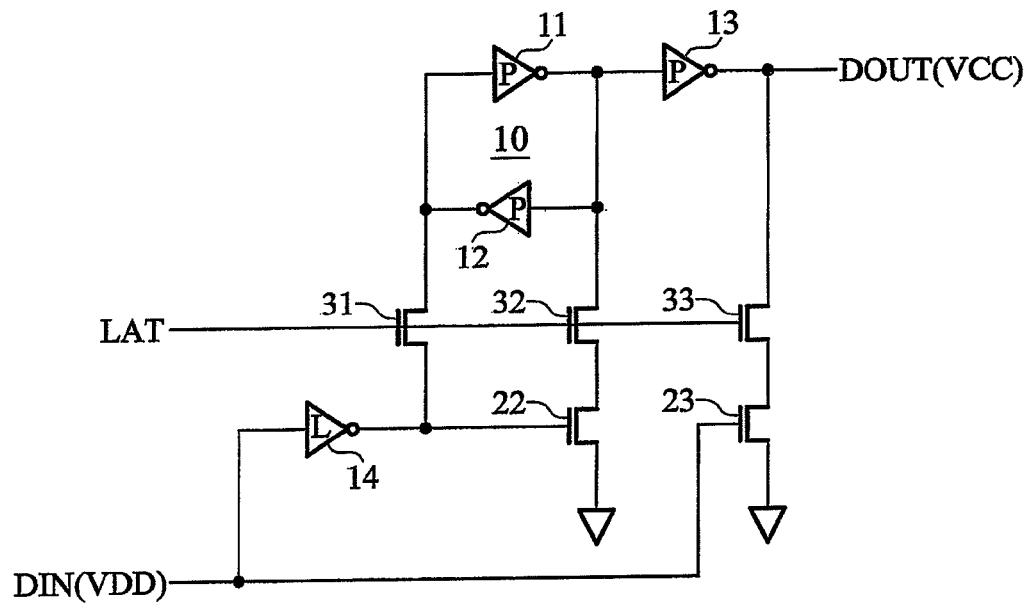
FIG. 3 is a circuit diagram illustrating a third embodiment of a level shift circuit according to the invention using the simple symbol of inverters.

FIG. 3 is a circuit diagram illustrating a third embodiment of a level shift circuit according to the invention using the simple symbol of inverters. To compare the level shift circuit of FIG. 3 with the level shift circuit of FIG. 1B, this embodiment is characterized in that (1) the NMOS transistor 21 has been removed, and (2) the output voltage from the inverter 14 is applied to the predetermined electrode (the lower electrode as shown in FIG. 3, a source electrode or a drain electrode, and different from the electrode connected to the output terminal of the inverter 12 and the gate electrode of NMOS transistor 31) of the NMOS transistor 31.

The level shift circuit of FIG. 3 described above operates as the same as the level shift circuit of FIG. 1B does, with the same effects.

Fourth Embodiment

Figure 4:
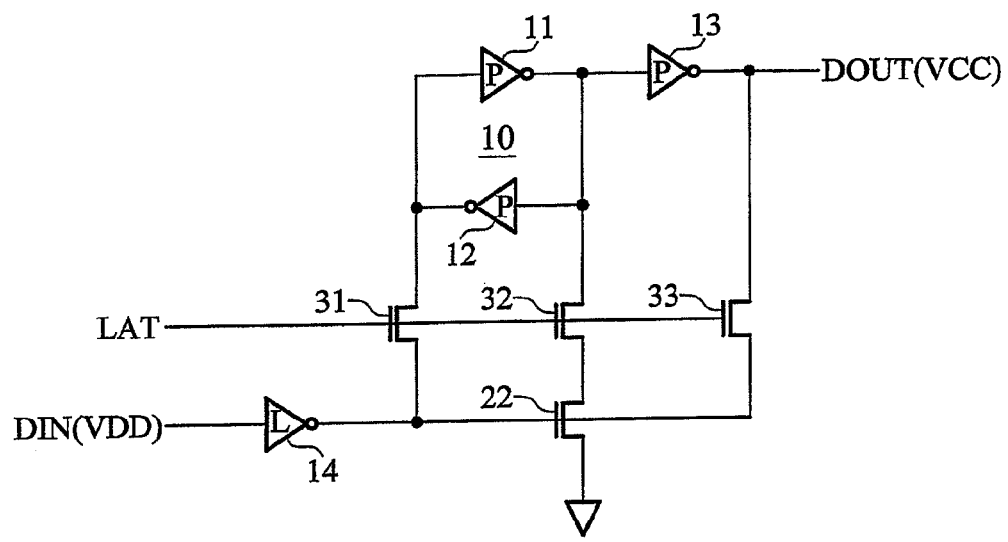
FIG. 4 is a circuit diagram illustrating a fourth embodiment of a level shift circuit according to the invention using the simple symbol of inverters.

FIG. 4 is a circuit diagram illustrating a fourth embodiment of a level shift circuit according to the invention using the simple symbol of inverters. To compare the level shift circuit of FIG. 4 with the level shift circuit of FIG. 2, this embodiment is characterized in that (1) the NMOS transistor 21 has been removed, and (2) the output voltage from the inverter 14 is applied to the predetermined electrode (the lower electrode as shown in FIG. 4, a source electrode or a drain electrode, and different from the electrode connected to the output terminal of the inverter 12 and the gate electrode of NMOS transistor 31) of the NMOS transistor 31.

The level shift circuit of FIG. 4 described above operates as the same as the level shift circuit of FIG. 2 does, with the same effects.

Fifth Embodiment

Figure 5:
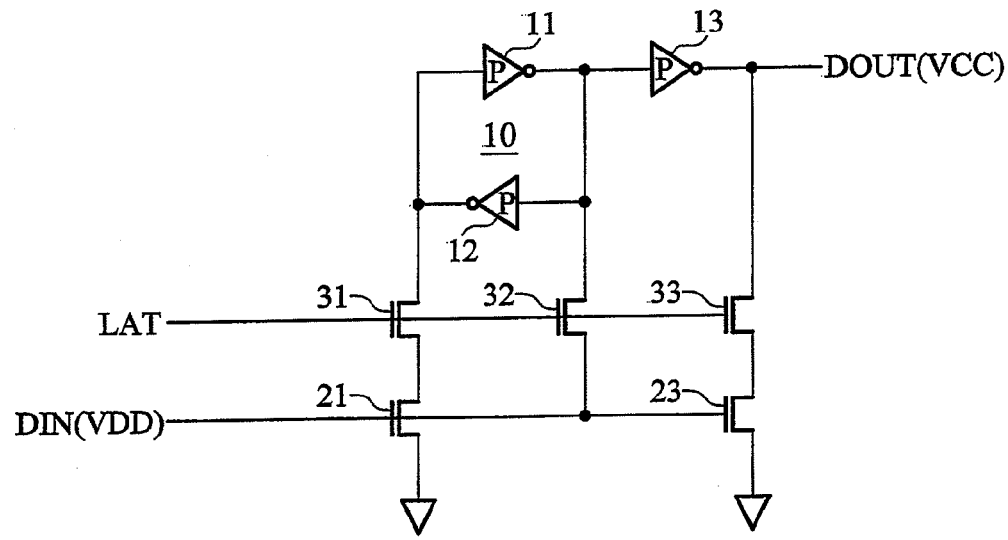
FIG. 5 is a circuit diagram illustrating a fifth embodiment of a level shift circuit according to the invention using the simple symbol of inverters.

FIG. 5 is a circuit diagram illustrating a fifth embodiment of a level shift circuit according to the invention using the simple symbol of inverters. To compare the level shift circuit of FIG. 5 with the level shift circuit of FIG. 1B, this embodiment is characterized in that (1) the NMOS transistor 22 and the inverter 14 have been removed, and (2) the input data signal DIN is applied to the predetermined electrode (the lower electrode as shown in FIG. 5, a source electrode or a drain electrode, and different from the electrode connected to the output terminal of the inverter 11 and the gate electrode of NMOS transistor 32) of the NMOS transistor 32.

The level shift circuit of FIG. 5 described above operates as the same as the level shift circuit of FIG. 1B does, with the same effects.

Sixth Embodiment

Figure 6:
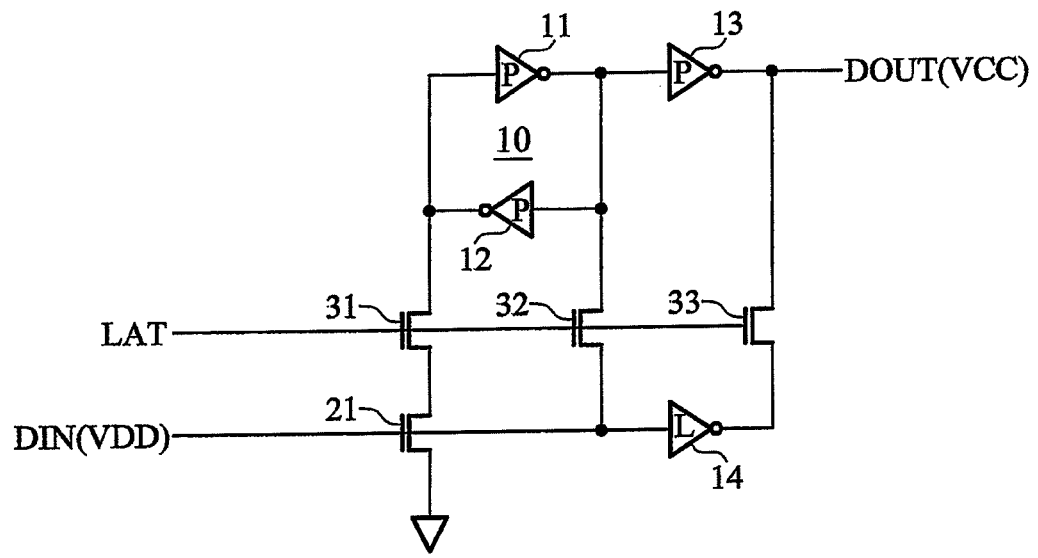
FIG. 6 is a circuit diagram illustrating a sixth embodiment of a level shift circuit according to the invention using the simple symbol of inverters.

FIG. 6 is a circuit diagram illustrating a sixth embodiment of a level shift circuit according to the invention using the simple symbol of inverters. To compare the level shift circuit of FIG. 6 with the level shift circuit of FIG. 2, this embodiment is characterized in that (1) the NMOS transistor 22 has been removed, and (2) the input data signal DIN is applied to the predetermined electrode (the lower electrode as shown in FIG. 6, a source electrode or a drain electrode, and different form the electrode connected to the output terminal of the inverter 11 and the gate electrode of NMOS transistor 32) of the NMOS transistor 32.

The level shift circuit of FIG. 6 described above operates as the same as the level shift circuit of FIG. 2 does, with the same effects.

Seventh Embodiment

Figure 7:
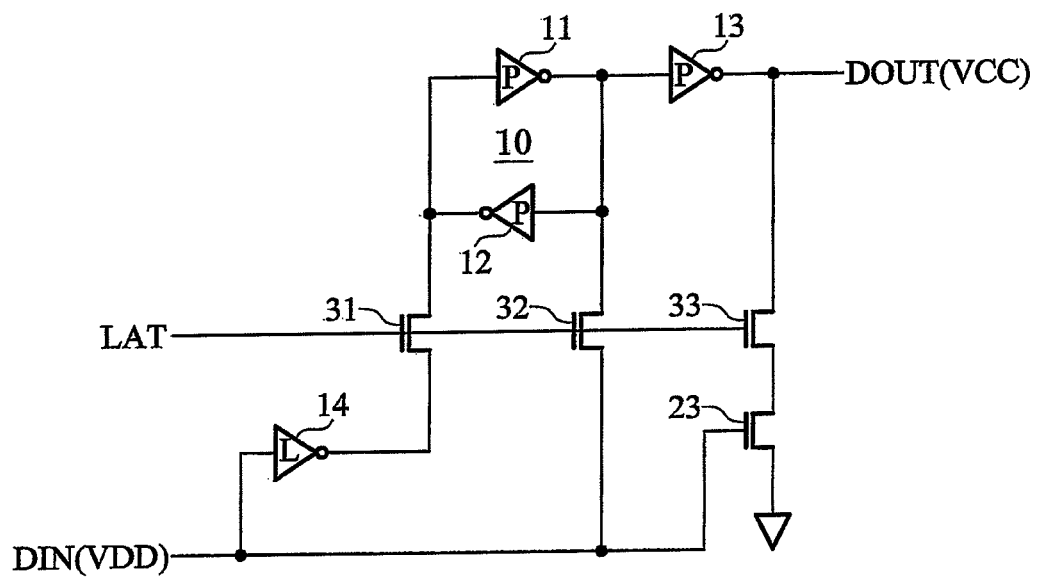
FIG. 7 is a circuit diagram illustrating a seventh embodiment of a level shift circuit according to the invention using the simple symbol of inverters.

FIG. 7 is a circuit diagram illustrating a seventh embodiment of a level shift circuit according to the invention using the simple symbol of inverters. To compare the level shift circuit of FIG. 7 with the level shift circuit of FIG. 3, this embodiment is characterized in that (1) the NMOS transistor 22 has been removed, and (2) the input data signal DIN is applied to the predetermined electrode (the lower electrode as shown in FIG. 7, a source electrode or a drain electrode, and different from the electrode connected to the output terminal of the inverter 11 and the gate electrode of NMOS transistor 32) of the NMOS transistor 32.

The level shift circuit of FIG. 7 described above operates as the same as the level shift circuit of FIG. 3 does, with the same effects.

Eighth Embodiment

Figure 8:
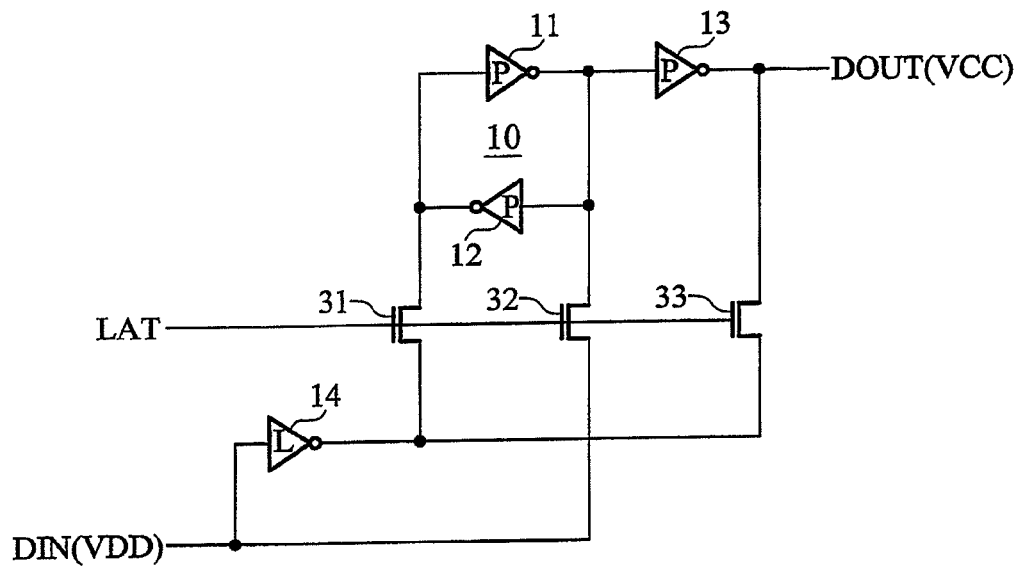
FIG. 8 is a circuit diagram illustrating an eighth embodiment of a level shift circuit according to the invention using the simple symbol of inverters.

FIG. 8 is a circuit diagram illustrating an eighth embodiment of a level shift circuit according to the invention using the simple symbol of inverters. To compare the level shift circuit of FIG. 8 with the level shift circuit of FIG. 4, this embodiment is characterized in that (1) the NMOS transistor 22 has been removed, and (2) the input data signal DIN is applied to the predetermined electrode (the lower electrode as shown in FIG. 8, a source electrode or a drain electrode, and different from the electrode connected to the output terminal of the inverter 11 and the gate electrode of NMOS transistor 32) of the NMOS transistor 32.

The level shift circuit of FIG. 8 described above operates as the same as the level shift circuit of FIG. 4 does, with the same effects.

Ninth Embodiment

Figure 9:
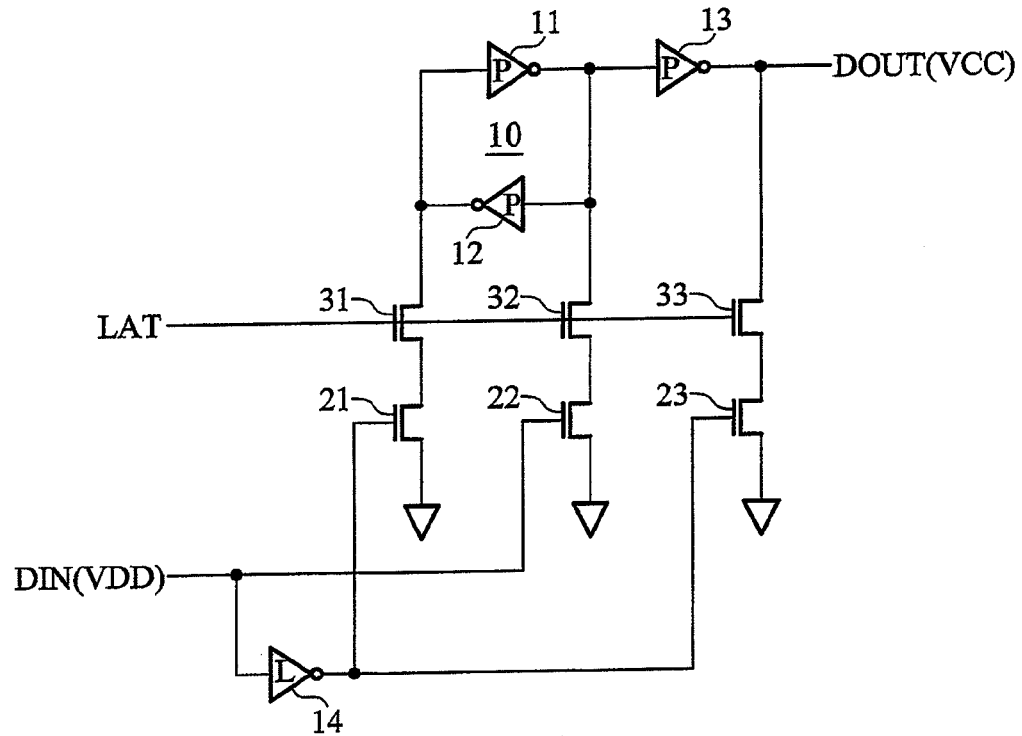
FIG. 9 is a circuit diagram illustrating a ninth embodiment of a level shift circuit according to the invention using the simple symbol of inverters.

FIG. 9 is a circuit diagram illustrating a ninth embodiment of a level shift circuit according to the invention using the simple symbol of inverters. To compare the level shift circuit of FIG. 9 with the level shift circuit of FIG. 1B, this embodiment is characterized in that (1) the input data signal DIN is applied to the gate electrode of the NMOS transistor 22, and (2) the input data signal DIN is inputted to the inverter 14, and the output voltage from the inverter 14 is applied to each of the gate electrodes of the NMOS transistors 21 and 23.

For the level shift circuit of FIG. 9 described above, the NMOS transistors 31, 32 and 33 are turned on when the latch signal LAT with a high level is inputted when a latching operation is being performed. At this time, when the input data signal DIN (VDD) falls, and the output data signal DOUT (VCC) for outputting the data of the latch 10 falls, the NMOS transistor 23 forces the output data signal DOUT to be set to a low level, such that the delay time between when the input data signal DIN falls and when the output data signal DOUT falls can be much reduced in comparison to that of prior art. Thus, the time margin of the output cycle of the data signal can increase.

Tenth Embodiment

Figure 10:
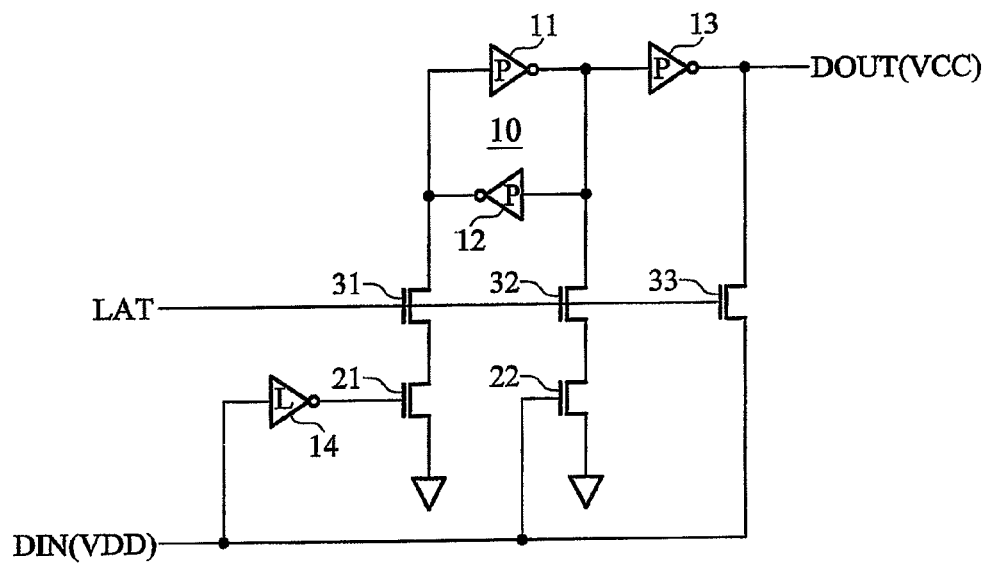
FIG. 10 is a circuit diagram illustrating a tenth embodiment of a level shift circuit according to the invention using the simple symbol of inverters.

FIG. 10 is a circuit diagram illustrating a tenth embodiment of a level shift circuit according to the invention using the simple symbol of inverters. To compare the level shift circuit of FIG. 10 with the level shift circuit of FIG. 9, this embodiment is characterized in that (1) the NMOS transistor 23 has been removed, and (2) the input data signal DIN is applied to the predetermined electrode (the lower electrode as shown in FIG. 10, is a source electrode or a drain electrode, different from the electrode connected to the output terminal of the inverter 13 and the gate electrode of NMOS transistor 33) of the NMOS transistor 33.

The level shift circuit of FIG. 10 described above operates as the same as the level shift circuit of FIG. 9 does, particularly, the NMOS transistors 31, 32 and 33 are turned on when the latch signal LAT with high level is inputted when a latching operation is being performed. At this time, when the input data signal DIN (VDD) falls, and the output data signal DOUT (VCC) for outputting the data of the latch 10 falls, the output data signal DOUT is forced to be set to a low level by the input data signal DIN, such that the delay time between when the input data signal DIN falls and when the output data signal DOUT falls can be much reduced in comparison to that of prior art. Thus, the time margin of the output cycle of the data signal can increase.

Eleventh Embodiment

Figure 11:
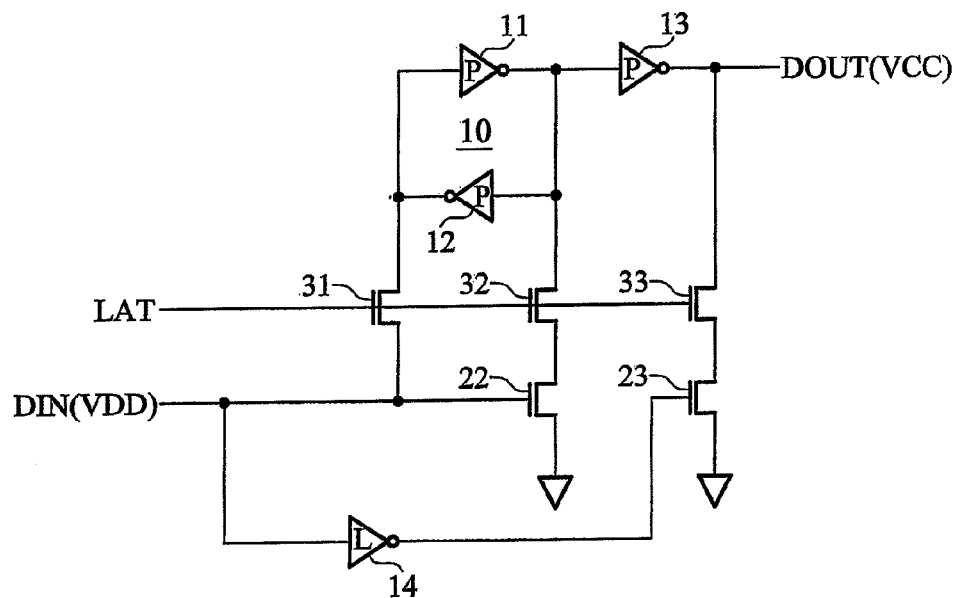
FIG. 11 is a circuit diagram illustrating an eleventh embodiment of a level shift circuit according to the invention using the simple symbol of inverters.

FIG. 11 is a circuit diagram illustrating an eleventh embodiment of a level shift circuit according to the invention using the simple symbol of inverters. To compare the level shift circuit of FIG. 11 with the level shift circuit of FIG. 9, this embodiment is characterized in that (1) the NMOS transistor 21 has been removed, and (2) the input data signal DIN is applied to the predetermined electrode (the lower electrode as shown in FIG. 11, is a source electrode or a drain electrode, different from the electrode connected to the output terminal of the inverter 12 and the gate electrode of NMOS transistor 31) of the NMOS transistor 31.

The level shift circuit of FIG. 11 described above operates as the same as the level shift circuit of FIG. 9 does, with the same effects.

Twelfth Embodiment

Figure 12:
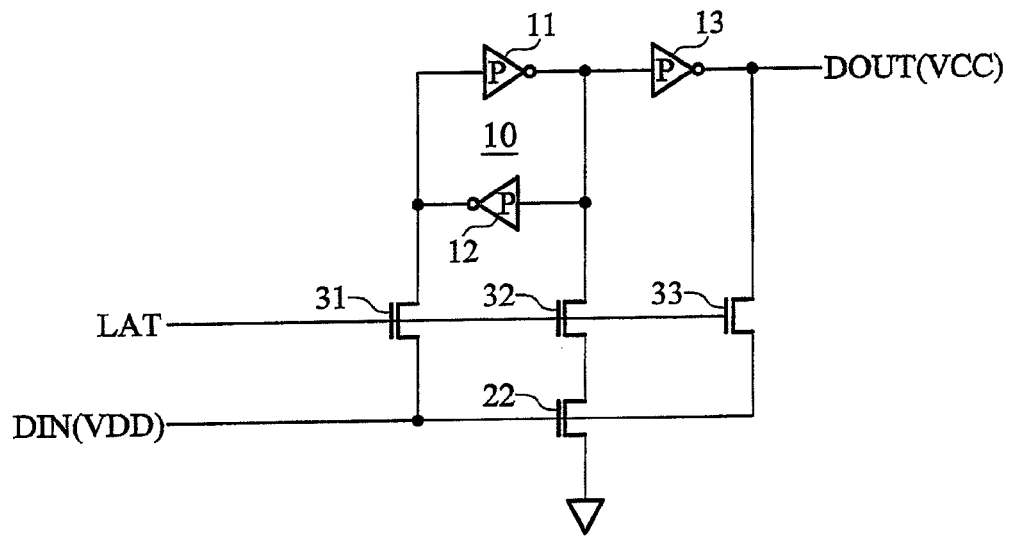
FIG. 12 is a circuit diagram illustrating a twelfth embodiment of a level shift circuit according to the invention using the simple symbol of inverters.

FIG. 12 is a circuit diagram illustrating a twelfth embodiment of a level shift circuit according to the invention using the simple symbol of inverters. To compare the level shift circuit of FIG. 12 with the level shift circuit of FIG. 10, this embodiment is characterized in that (1) the NMOS transistor 21 and the inverter 14 has been removed, and (2) the input data signal DIN is applied to the predetermined electrode (the lower electrode as shown in FIG. 12, is a source electrode or a drain electrode, different from the electrode connected to the output terminal of the inverter 12 and the gate electrode of NMOS transistor 31) of the NMOS transistor 31.

The level shift circuit of FIG. 12 described above operates as the same as the level shift circuit of FIG. 10 does, with the same effects.

Thirteenth Embodiment

Figure 13:
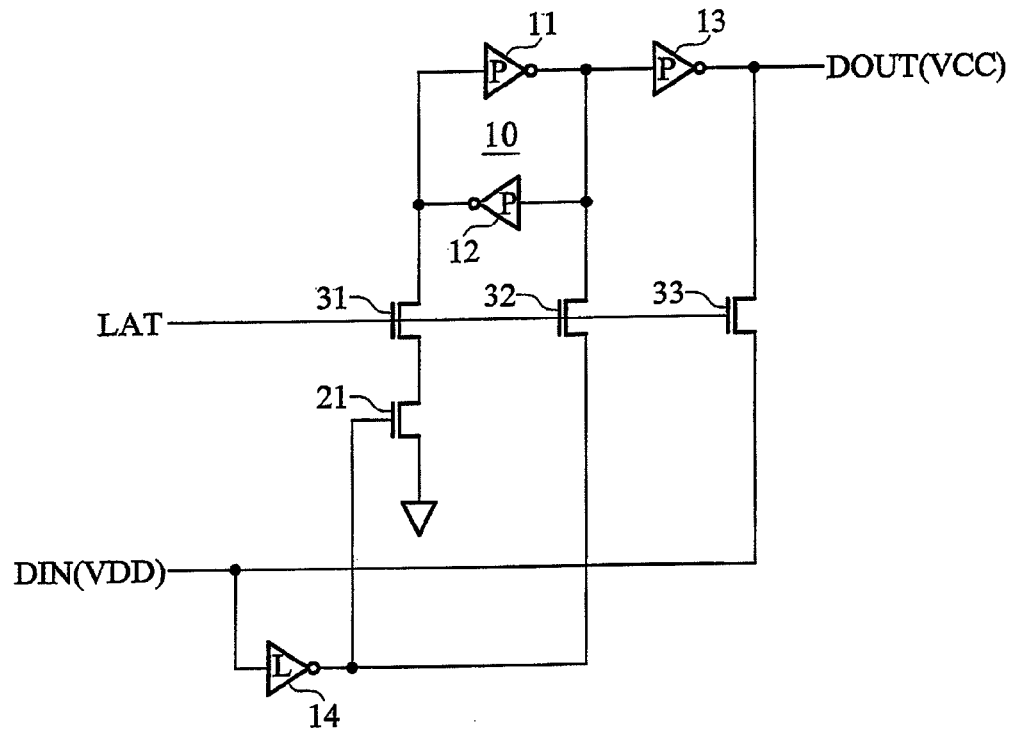
FIG. 13 is a circuit diagram illustrating a thirteenth embodiment of a level shift circuit according to the invention using the simple symbol of inverters.

FIG. 13 is a circuit diagram illustrating a thirteenth embodiment of a level shift circuit according to the invention using the simple symbol of inverters. To compare the level shift circuit of FIG. 13 with the level shift circuit of FIG. 10, this embodiment is characterized in that (1) the NMOS transistor 22 has been removed, and (2) the input data signal DIN is inputted to the inverter 14, and the output voltage from the inverter 14 is applied to the predetermined electrode (the lower electrode as shown in FIG. 13, is a source electrode or a drain electrode, different from the electrode connected to the output terminal of the inverter 11 and the gate electrode of NMOS transistor 32) of the NMOS transistor 32.

The level shift circuit of FIG. 13 described above operates as the same as the level shift circuit of FIG. 10 does, with the same effects.

Fourteenth Embodiment

Figure 14:
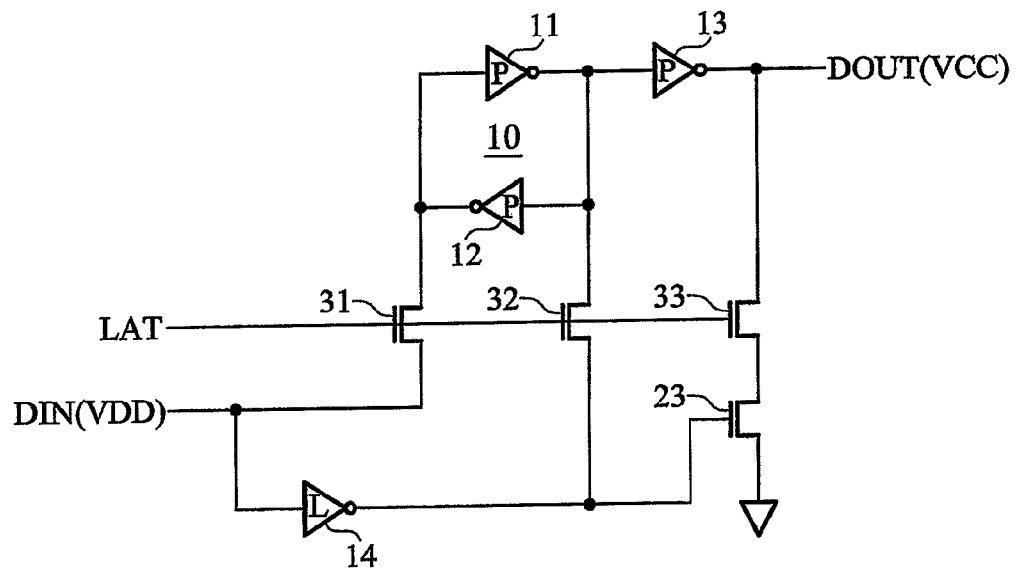
FIG. 14 is a circuit diagram illustrating a fourteenth embodiment of a level shift circuit according to the invention using the simple symbol of inverters.

FIG. 14 is a circuit diagram illustrating a fourteenth embodiment of a level shift circuit according to the invention using the simple symbol of inverters. To compare the level shift circuit of FIG. 14 with the level shift circuit of FIG. 11, this embodiment is characterized in that (1) the NMOS transistor 22 has been removed, and (2) the input data signal DIN is inputted to the inverter 14, and the output voltage from the inverter 14 is applied to the predetermined electrode (the lower electrode as shown in FIG. 14, is a source electrode or a drain electrode, different from the electrode connected to the output terminal of the inverter 11 and the gate electrode of NMOS transistor 32) of the NMOS transistor 32.

The level shift circuit of FIG. 14 described above operates as the same as the level shift circuit of FIG. 11 does, with the same effects.

Fifteenth Embodiment

Figure 15:
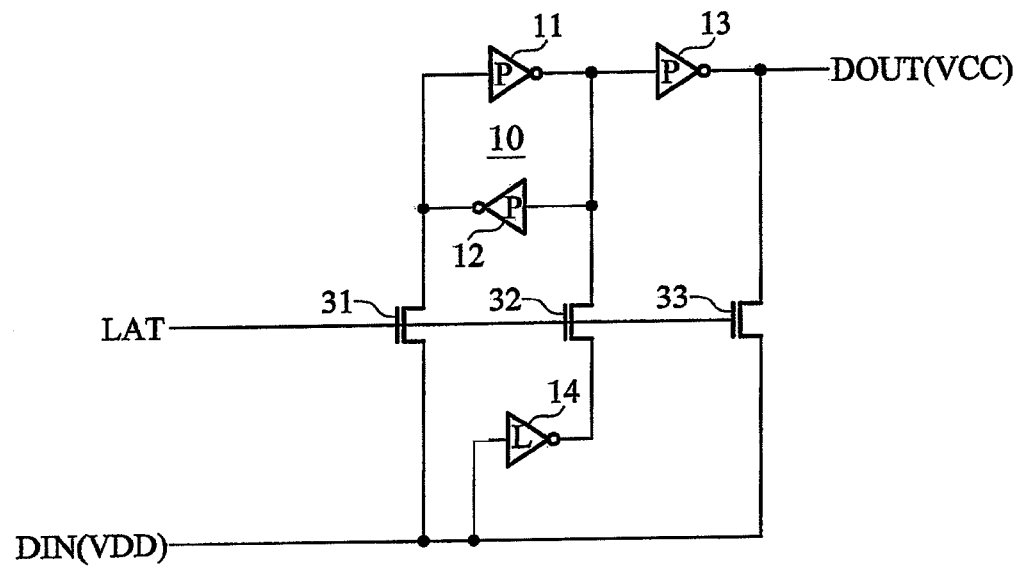
FIG. 15 is a circuit diagram illustrating a fifteenth embodiment of a level shift circuit according to the invention using the simple symbol of inverters.

FIG. 15 is a circuit diagram illustrating a fifteenth embodiment of a level shift circuit according to the invention using the simple symbol of inverters. To compare the level shift circuit of FIG. 15 with the level shift circuit of FIG. 12, this embodiment is characterized in that (1) the NMOS transistor 22 has been removed, (2) the inverter 14 has been added, and (3) the input data signal DIN is inputted to the inverter 14, and the output voltage from the inverter 14 is applied to the predetermined electrode (the lower electrode as shown in FIG. 14, is a source electrode or a drain electrode, different from the electrode connected to the output terminal of the inverter 11 and the gate electrode of NMOS transistor 32) of the NMOS transistor 32.

The level shift circuit of FIG. 15 described above operates as the same as the level shift circuit of FIG. 12 does, with the same effects.

Sixteenth Embodiment

Figure 16:
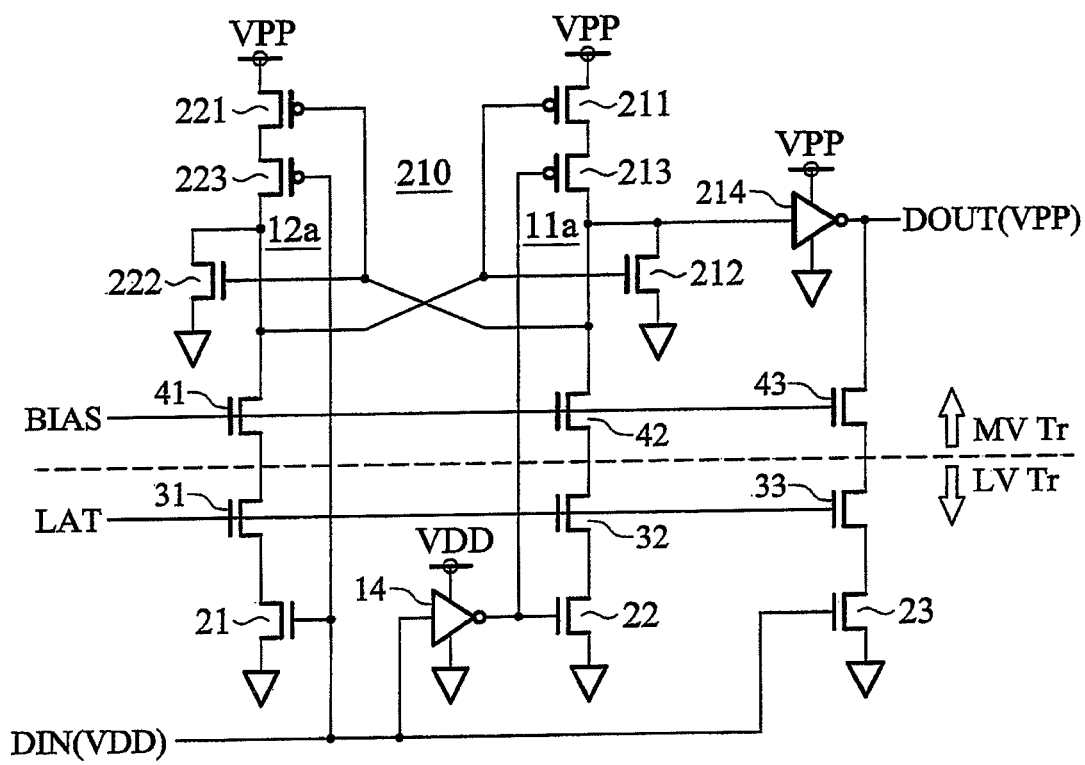
FIG. 16 is a circuit diagram illustrating the sixteenth embodiment of a level shift circuit according to the invention.

FIG. 16 is a circuit diagram illustrating the sixteenth embodiment of a level shift circuit according to the invention. The level shift circuit of FIG. 16 has a circuit for level-shifting an input data signal DIN (VDD) to an output data signal DOUT (VPP, in this embodiment, VPP is a middle voltage or high voltage higher than VDD and VCC, such as 5V). To compare the level shift circuit of FIG. 16 with the level shift circuit of FIG. 1A, this embodiment is characterized in that the level shift circuit comprises (1) a bias voltage circuit consisting of NMOS transistors 41, 42 and 43 being turned on in response to a bias signal BIAS with a high level (high level while the latch operation), (2) a middle voltage transistor group (MV Tr) consisting of a latch 210 and an output inverter 214, and (3) a low voltage transistor group (LV Tr) consisting of NMOS transistors 31, 32 and 33 being turned on in response to a latch signal LAT, NMOS transistors 2L 22, 23, and an inverter 14.

Figure 17A:
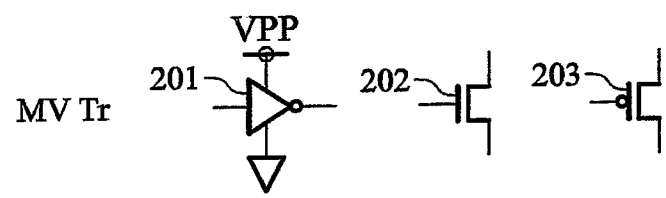
FIGS. 17a and 17b are diagrams showing symbols of the inverter and the MOS transistor using in the level shift circuit in FIG. 16, FIG. 18 and FIG. 19.
Figure 17B:
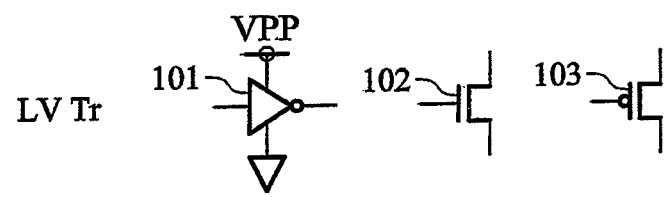
Figure 18:
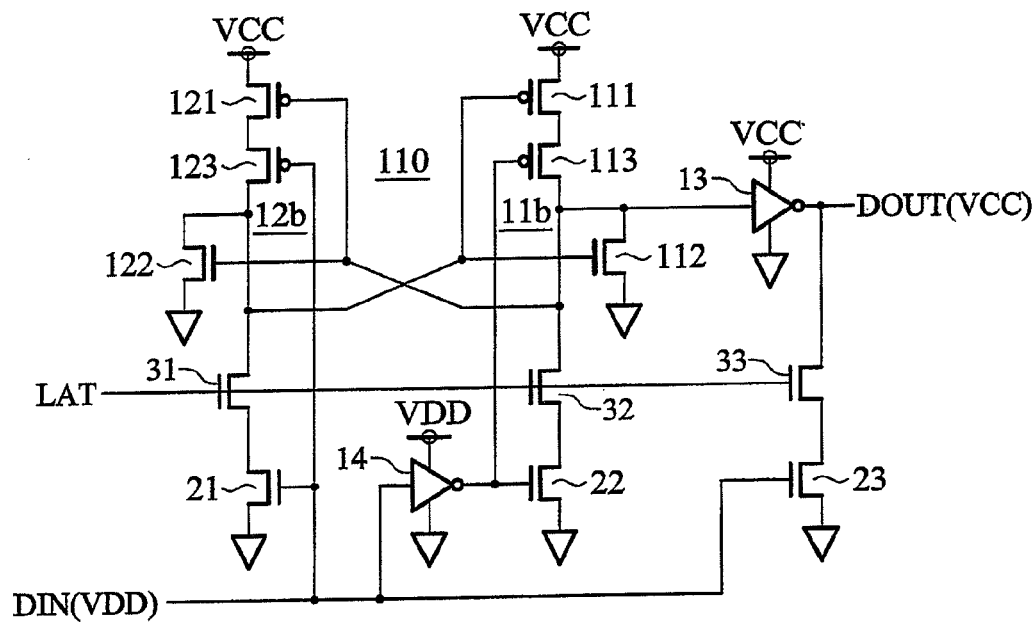
FIG. 18 is a circuit diagram illustrating a seventeenth embodiment of a level shift circuit according to the invention.
Figure 19:
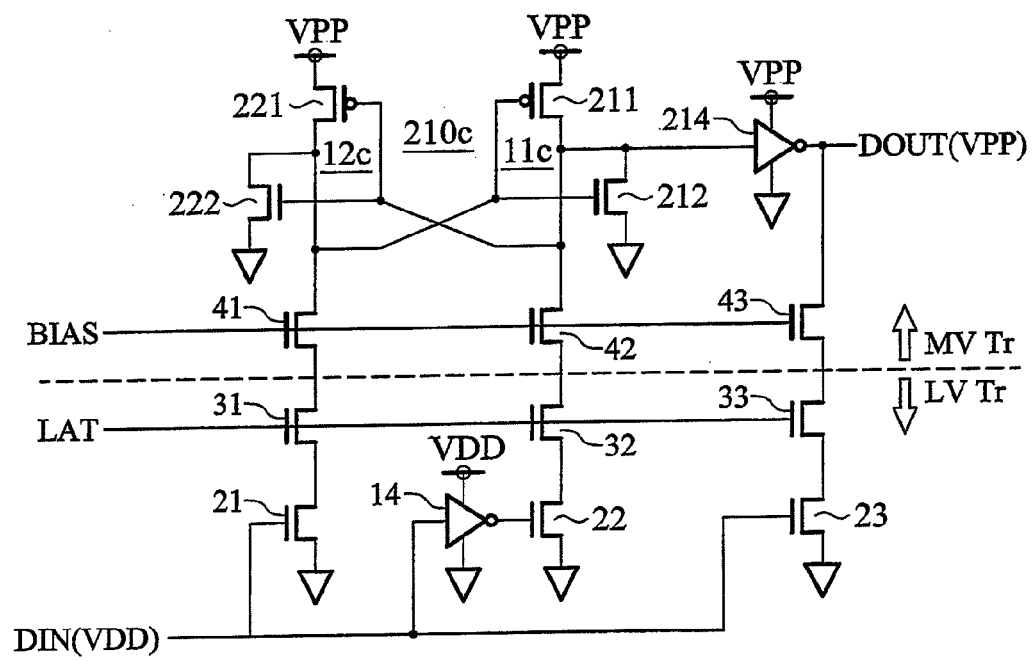
FIG. 19 is a circuit diagram illustrating an eighteenth embodiment of a level shift circuit according to the invention.

FIGS. 17a and 17b are diagrams showing a symbol of the inverter and the MOS transistor using in the level shift circuit in FIG. 16, FIG. 18 and FIG. 19. FIG. 17a shows the inverter 201, the NMOS transistor 202, and the PMOS transistor 203 being configured to the middle voltage transistor group (MV Tr), Also, FIG. 17b shows the inverter 101, the NMOS transistor 102, and the PMOS transistors 103 being are configured to the low voltage transistor group (LV Tr).

In the level shift circuit of FIG. 16, the latch 210 consists of inverters 11a and 12a. The inverter 11a comprises PMOS transistors 211, 213 and an NMOS transistor 212. The inverter 12a comprises PMOS transistors 221, 223 and an NMOS transistor 222. In this embodiment, the inverters 11a and 12a comprise the PMOS transistors 213 and 223 respectively for preventing the break down of the MOS transistor, and form a PMOS transistor insertion flip-flop type latch.

The level shift circuit described above operates as the same as the level shift circuits of FIGS. 1A and 1B do, particularly, in the latching operation, wherein the NMOS transistors 41, 42 and 43 are turned on when the bias signal BIAS with a high level is inputted, and the NMOS transistor 33 is turned on when the latch signal LAT with high level is inputted. At this time, when the input data signal DIN (VDD) rises, and the output data signal DOUT (VPP) from the output inverter 214 for outputting the data of the latch 210 falls, the NMOS transistor 23 turns on in order to force the output level of the output inverter 214 to be set to a low level, such that the delay time between when the input data signal DIN rises and when the output data signal DOUT falls can be much reduced in comparison to that of prior art. Thus, the time margin of the output cycle of the data signal can increase.

Although the PMOS transistors 213 and 223 are inserted and connected to the power voltage VPP in the embodiment described above, the invention is not limited thereto. In order to get a higher withstand voltage, NMOS transistors can be inserted and connected to the ground. In this embodiment, the latch 210 may consist of eight MOS transistors.

Seventeenth Embodiment

FIG. 18 is a circuit diagram illustrating a seventeenth embodiment of a level shift circuit according to the invention. To compare the level shift circuit of FIG. 18 with the level shift circuit of FIG. 16, this embodiment is characterized in that (1) the bias circuit has been removed, and (2) the latch 210 and the inverter 214 are formed by a latch 110 and an inverter 13, and the latch 110 and the inverter 13 operates by low voltage level transistors.

In the level shift circuit of FIG. 18, the latch 110 consists of inverters 11b and 12b. The inverter 11b comprises PMOS transistors 111, 113 and an NMOS transistor 112. The inverter 12b comprises PMOS transistors 121, 123 and an NMOS transistor 122. In this embodiment, the inverters 11b and 12b have the insertion of the PMOS transistors 113 and 123 respectively for preventing the break down of the MOS transistor, and form a PMOS transistor insertion flip-flop type latch.

The level shift circuit described above operates as the same as the level shift circuits of FIGS. 1A and 1B do, particularly, in the latching operation, wherein the NMOS transistor 33 is turned on when the latch signal LAT with high level is inputted. At this time, when the input data signal DIN (VDD) rises, and the output data signal DOUT (VPP) from the output inverter 13 for outputting the data of the latch 110 falls, the NMOS transistor 23 turns on in order to force the output level of the output inverter 13 to be set to a low level, such that the delay time between when the input data signal DIN rises and when the output data signal DOUT falls can be much reduced in comparison to that of prior art. Thus, the time margin of the output cycle of the data signal can increase.

Although the PMOS transistors 113 and 123 are inserted and connected to the power voltage VCC in the embodiment described above, the invention is not limited thereto. In order to get a higher withstand voltage, NMOS transistors can be inserted and connected to the ground. In this embodiment, the latch 110 may consist of eight MOS transistors.

Eighteenth Embodiment

FIG. 19 is a circuit diagram illustrating an eighteenth embodiment of a level shift circuit according to the invention. To compare the level shift circuit of FIG. 19 with the level shift circuit of FIG. 16, this embodiment is characterized in that (1) an inverter 11c replaces the inverter 11a, wherein the transistors 213 has been removed, (2) an inverter 12c replaces the inverter 12a, wherein the PMOS transistors 223 has been removed, and (3) a latch 210c consists of the inverter 11c and 12c.

The level shift circuit described above operates as the same as the level shift circuit of FIG. 16 does, with the same effects.

Modified Embodiment

Figure 22:
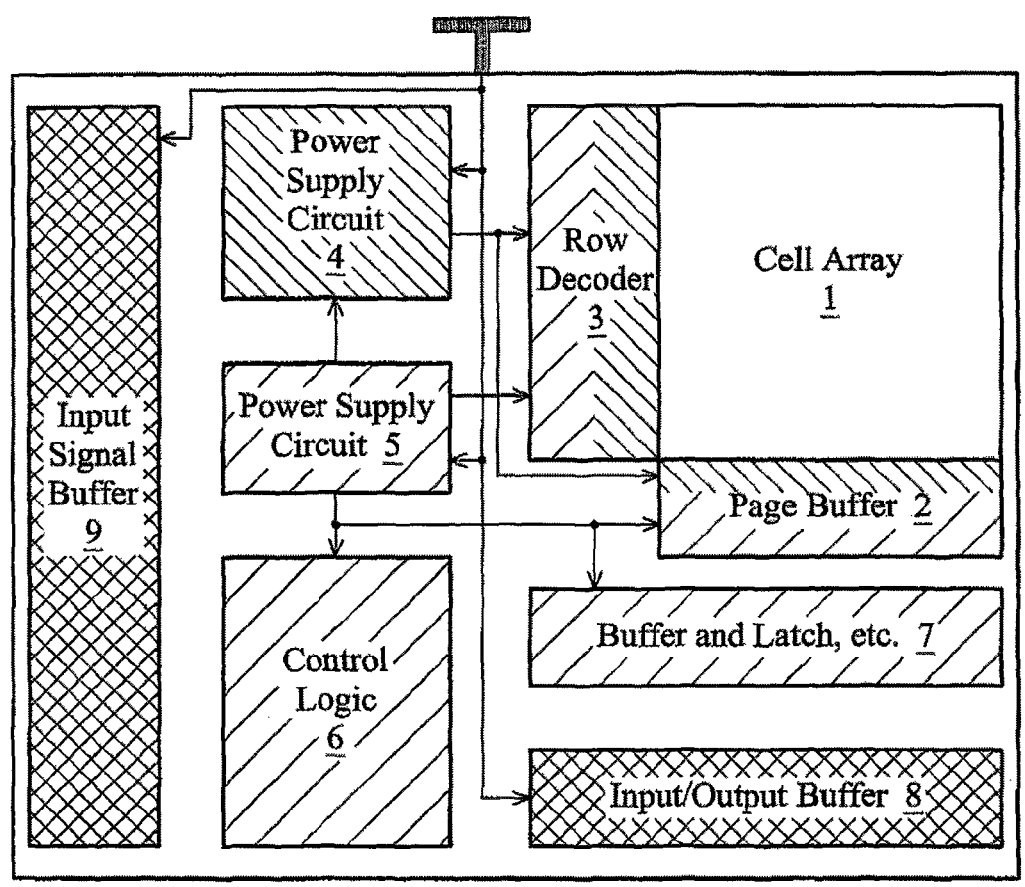
FIG. 22 is a block diagram illustrating a power supply voltage usage state of each circuit when the external power supply voltage VCC=3.3V is applied to the flash memory of the prior art.
Figure 23:
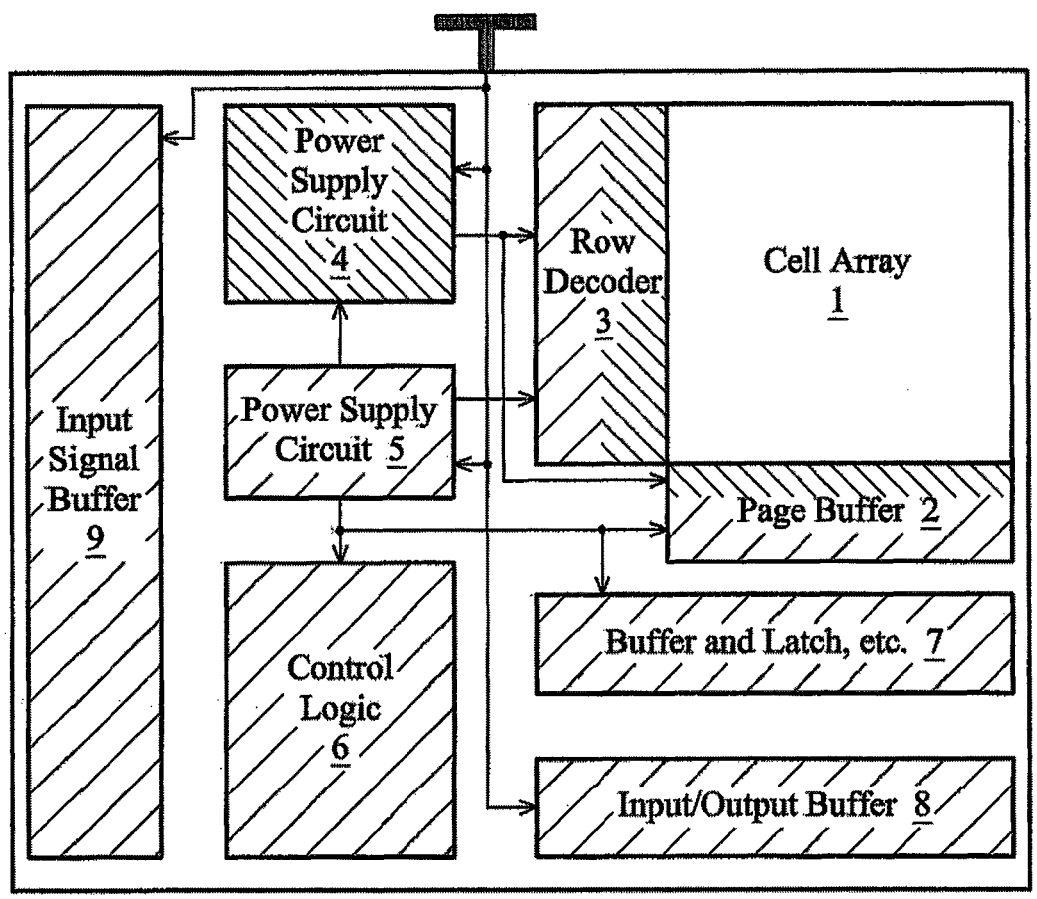
FIG. 23 is a block diagram illustrating a power supply voltage usage state of each circuit when the external power supply voltage VCC=1.8V is applied to the flash memory of the prior art.
Figure 24:
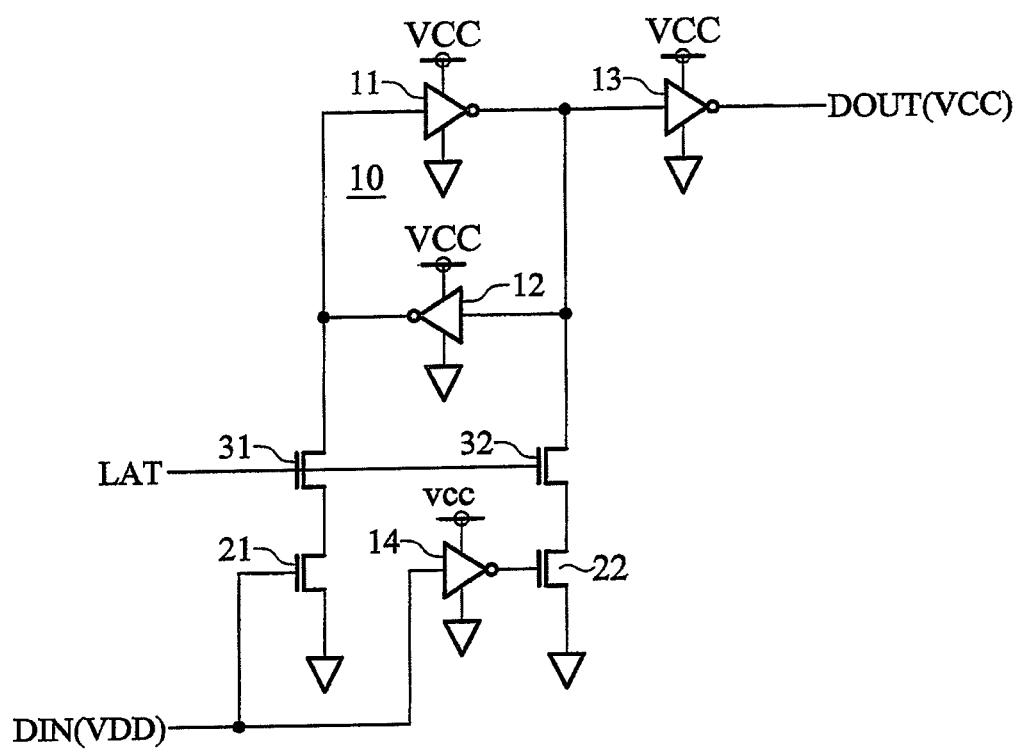
FIG. 24 is a circuit diagram illustrating an embodiment of a level shift circuit according to the prior art.

In the embodiments described above, although the level shift circuit has been described, these level shift circuits are further illustrated with reference to FIGS. 22 and 23, and are further configured in semiconductor devices such as a flash memory. In this embodiment, the semiconductor device is a semiconductor device which can be used for two supply voltages with a first level and a second level in the same device.

In the sixteenth to the eighteenth embodiments described above, various level shift circuits are illustrated according to the basic level shift circuit of the first embodiment, but the present invention is not limited thereto. The basic level shift circuit of the second to the fifteenth embodiments may be configured similar to the feature configurations (the latch and its peripheral circuit) of the embodiments of the sixteenth to eighteenth embodiments.

In the sixteenth to the eighteenth embodiments, the level-shift of the input data signal DIN (VDD) to the output data signal DOUT (VPP) has been described, but the present invention is not limited thereto. The circuit may be configured similarly to the level shift of the input data signal DIN (VDD) to the output data signal DOUT (high voltage, HV).

Embodiments

The inventors of the present invention performed simulations SPICE (Simulation Program with Integrated Circuit Emphasis) to the level shift circuit of FIG. 1A of the first embodiment, and measured delay times of data signals (the period time from the falling edge the rising edge of the data signal, or the period time from the rising edge to the falling edge of the data signal).

FIG. 20 is a table illustrating the experimental results of the delay time of the level shift circuit of FIG. 1A in the worst state (100° C. temperature), FIG. 21 is a table illustrating the experimental results of the delay time of the level shift circuit of FIG. 1A in the standard state (20° C. temperature). For the condition where the VDD is the same as the VCC, the delay time between when the input data signal DIN rises and when the output data signal DOUT falls, has been reduced from 5.4 ns as in the prior art to 0.9 ns in the standard state. However, in particular, in the worst state, the delay time may be further reduced from 12.1 ns as in the prior art to 2.4 ns. Thus, the time margin of the output cycle of the data signal can increase.

INDUSTRIAL APPLICATIONS

As described above, in the present invention, the delay time between when the input data signal changes from the predetermined voltage to the same voltage and the output data signal falls can be much reduced in comparison to that of prior art. Thus, the time margin of the output cycle of the data signal can increase. The level shift circuit can be used in semiconductor devices such as a flash memory for example.

What is claimed is:

1. A level shift circuit, for shifting an input data signal with a first level to a second level, and outputting an output data signal with the second level through an output terminal of an output inverter, comprising:
   a latch, for holding the input data signal with the second level in response to a latch signal; and
   a level set circuit, connected to the output terminal of the output inverter, wherein the level set circuit forces the output data signal to be set to a low level in response to the input data signal and the latch signal,
   wherein the output inverter is connected between the second level and ground potential.

2. The level shift circuit of claim 1, wherein the level set circuit comprises a first NMOS transistor having one electrode connected to ground and another electrode connected to the output terminal of the output inverter through a second NMOS transistor, and the first NMOS transistor turns on in response to the input data signal with a high level, and the second NMOS transistor turns on in response to the latch signal.

3. The level shift circuit of claim 1, wherein the level set circuit comprises a first inverter inverting the input data signal with a high level to an inverted signal, and outputting the inverted signal to the output terminal of the output inverter through an NMOS transistor, and the NMOS transistor turns on in response to the latch signal.

4. The level shift circuit of claim 1, wherein the level set circuit further comprises:
   a second inverter, inverting the input data signal with a low level to an inverted signal; and
   a NMOS transistor, having a drain electrode and a source electrode coupled to a ground,
   wherein the NMOS transistor turns on in response to the inverted signal.

5. The level shift circuit of claim 1, wherein the level set circuit outputs the input data signal with a low level to the output terminal of the output inverter.

6. The level shift circuit of claim 1, wherein the latch has two inverters connected in cascade to each other.

7. The level shift circuit of claim 6, wherein the latch has four MOS transistors, and the latch is a CMOS flip-flop type latch.

8. The level shift circuit of claim 6, wherein the latch comprises two PMOS transistors respectively inserted between the two inverters and a power voltage, wherein the latch totally has six MOS transistors, and the latch is a CMOS flip-flop type latch.

9. The level shift circuit of claim 6, wherein the latch comprises two PMOS transistors respectively inserted between the two inverters and a power voltage, and two NMOS transistors respectively inserted between the two inverters and a ground, wherein the latch totally has eight MOS transistors, and the latch is a CMOS flip-flop type latch.

10. The level shill circuit of claim 1, wherein the latch and the output inverter comprise transistors driven by a high power supply voltage higher than the first level, and the second level is higher than the first level.

11. The level shift circuit of claim 1, wherein the level shift circuit is a semiconductor device in capable of being used for two power supply voltages with the first level and the second level.

12. The level shift circuit of claim 11, wherein the semiconductor device is a flash memory.

13. The level shift circuit of claim 1, wherein the latch is independent of the output inverter.

14. A level shift circuit, receiving an input data signal with a first level and outputting an output data signal with a second level, comprising:
   a latch generating a latched signal;
   an output inverter inverting the latched signal to output the output data signal; and
   a level set circuit receiving the input data signal and a latch signal and coupled to an output terminal of the output inverter,
   wherein when the input data signal falls, the level set circuit sets the output data signal to a low level, and
   wherein the output inverter is connected between the second level and ground potential.

* * * * *